US012740032B2

(12) United States Patent
Kim et al.

(10) Patent No.: US 12,740,032 B2
(45) Date of Patent: Sep. 15, 2026

(54) DISPLAY DEVICE

(71) Applicant: LG Display Co., Ltd., Seoul (KR)

(72) Inventors: DaeYun Kim, Yongin-si (KR); Hyunsoo Um, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 250 days.

(21) Appl. No.: 18/782,305

(22) Filed: Jul. 24, 2024

(65) Prior Publication Data

US 2025/0267827 A1 Aug. 21, 2025

(30) Foreign Application Priority Data

Feb. 16, 2024 (KR) ........................ 10-2024-0022898

(51) Int. Cl.
*H05K 7/20* (2006.01)
*H05K 1/02* (2006.01)
*H05K 1/181* (2026.01)

(52) U.S. Cl.
CPC ....... *H05K 7/20963* (2013.01); *H05K 1/0203* (2013.01); *H05K 1/181* (2013.01)

(58) Field of Classification Search
CPC .. H05K 7/20963; H05K 1/0203; H05K 1/181; H05K 7/20954; H10K 59/8794; G06F 1/20; G02B 6/0085
USPC .......................................................... 361/704
See application file for complete search history.

(56) References Cited

U.S. PATENT DOCUMENTS 10,551,886 B1 * 2/2020 de la Fuente ...... H05K 7/20963
2020/0196492 A1 * 6/2020 Kim .................. G02F 1/133308
2020/0205320 A1 * 6/2020 Kong ................ H05K 7/20963
2021/0267089 A1 * 8/2021 Nagasawa .......... H05K 7/20536

FOREIGN PATENT DOCUMENTS

CN 102821582 A * 12/2012
KR 10-2017-0038229 A 4/2017

* cited by examiner

*Primary Examiner* — Jayprakash N Gandhi
*Assistant Examiner* — Kyle Oxenknecht
(74) *Attorney, Agent, or Firm* — Morgan, Lewis & Bockius LLP

(57) ABSTRACT

A display device may include a display panel; a reinforcement plate configured to support the display panel; a circuit component configured to operate the display panel; and a heat dissipation module configured to reduce the occurrence of thermal stress in the circuit component and the reinforcement plate by absorbing heat, which is generated from the circuit component, and transferring the heat to the reinforcement plate, wherein the heat dissipation module includes: first thermal deformation media and second thermal deformation media configured to adjoin the circuit component, absorb heat generated from the circuit component, and transfer the heat to the reinforcement plate; and a thermal conduction medium disposed between the first thermal deformation medium and the second thermal deformation medium and configured to transfer the heat between the first thermal deformation medium and the second thermal deformation medium.

18 Claims, 11 Drawing Sheets

DISPLAY DEVICE

CROSS-REFERENCE TO RELATED APPLICATIONS

This application claims the priority of Korean Patent Application No. 10-2024-0022898 filed on Feb. 16, 2024, in the Korean Intellectual Property Office, the disclosure of which is incorporated herein by reference.

BACKGROUND

Technical Field

The present disclosure relates to a display device, and more particularly, to a display device that absorbs and dissipates heat generated from a circuit component, which operates a display panel, thereby reducing the occurrence of thermal stress in the circuit component.

Discussion of the Related Art

Recently, display devices, which visually display electrical information signals, are being rapidly developed in accordance with the full-fledged entry into the information era. Various studies are being continuously conducted to develop a variety of display devices which are thin and lightweight, consume low power, and have improved performance.

As the representative display devices, there are a liquid crystal display (LCD) device, an electrowetting display (EWD) device, an organic light-emitting display (OLED) device, and the like.

Among the display devices, the display device including the organic light-emitting display device refers to a display device that autonomously emits light. Unlike a liquid crystal display device, the electroluminescent display device does not require a separate light source and thus may be manufactured as a lightweight, thin display device. In addition, the electroluminescent display device is advantageous in terms of power consumption because the electroluminescent display device operates at a low voltage. Further, the electroluminescent display device is expected to be adopted in various fields because the electroluminescent display device is also excellent in implementation of colors, response speeds, viewing angles, and contrast ratios (CRs).

Meanwhile, circuit components, i.e., a substrate and a driver IC mounted on the substrate, which operate a display panel in a display device, generate high-temperature heat when the display panel operates, and the generated heat causes separation of a bonding layer that bonds the panel and the circuit components.

SUMMARY

In the display device in the related art, the above-mentioned problem of the separation of the bonding layer caused by heat generated from the driver IC is solved by heat dissipation sheets with a so-called cut-out design in which the heat dissipation sheets and the bonding layers are attached to the panel in a staggered manner.

In the cut-out design, the heat dissipation sheets and the bonding layers are attached to the panel in a staggered manner, and an empty space remains between the driver IC and the panel to ensure thermal insulation, which inhibits the heat generated from the driver IC from being transferred to the panel.

However, even though the problem of the separation of the bonding layer is solved by applying the heat dissipation sheet with the cut-out design, a peak temperature occurs at a lower side of the panel on which the circuit components, such as a PCB and the driver IC, are disposed, which causes a problem in that temperature uniformity deteriorates.

The inventors of the present specification recognized the above-mentioned problems and invented a heat dissipation module capable of diffusing heat at a lower side of a panel, and a display device including the heat dissipation module.

Accordingly, embodiments of the present disclosure are directed to a display device that substantially obviates one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises display panel; a reinforcement plate configured to support the display panel; a circuit component configured to operate the display panel; and a heat dissipation module configured to reduce or minimize the occurrence of thermal stress in the circuit component and the reinforcement plate by absorbing heat, which is generated from the circuit component, and transferring the heat to the reinforcement plate, wherein the heat dissipation module comprises: first thermal deformation media and second thermal deformation media configured to adjoin the circuit component, absorb heat generated from the circuit component, and transfer the heat to the reinforcement plate; and a thermal conduction medium disposed between the first thermal deformation medium and the second thermal deformation medium and configured to transfer the heat between the first thermal deformation medium and the second thermal deformation medium.

In another aspect, a display device comprises a display panel; a reinforcement plate configured to support the display panel; a circuit component configured to operate the display panel; and a heat dissipation module configured to reduce or minimize the occurrence of thermal stress in the circuit component and the reinforcement plate by absorbing heat, which is generated from the circuit component, and transferring the heat to the reinforcement plate, wherein the circuit component comprises: a driver IC (D-IC) configured to operate the display panel; and a printed circuit board (PCB) on which the driver IC is mounted, and wherein the heat dissipation module comprises: a first thermal deformation medium configured to adjoin the driver IC, absorb heat generated from the driver IC, and transfer the absorbed heat to the reinforcement plate; a second thermal deformation medium configured to adjoin the printed circuit board, absorb heat from the printed circuit board, and transfer the heat the reinforcement plate; and a thermal conduction medium disposed between a predetermined zone of the first thermal deformation medium and a predetermined zone of the second thermal deformation medium and configured to transfer the heat between the first thermal deformation medium and the second thermal deformation medium.

Other detailed matters of the exemplary embodiments are included in the detailed description and the drawings.

The display device according to embodiments of the present specification absorbs heat from the circuit components, such as the driver IC and the printed circuit board, and transfers the absorbed heat to the reinforcement plate, thereby providing an effect of reducing or minimizing the occurrence of thermal stress in the circuit components and a heat dissipation plate.

The display device according to embodiments of the present specification provides an effect of thermally deforming the first thermal deformation media and the second thermal deformation media together in the longitudinal direction by the heat dissipation module having the triple structure including the first thermal deformation media and the second thermal deformation media, which are thermally deformed by absorbing heat generated from the circuit component, and the thermal conduction medium disposed between the first thermal deformation media and the second thermal deformation media and configured to exchange heat between the first thermal deformation media and the second thermal deformation media.

The display device according to embodiments of the present specification has the margin structures that define the internal space in the first thermal deformation media and the second thermal deformation media, thereby providing an effect of suppressing damage to the first thermal deformation media and the second thermal deformation media when the first thermal deformation media and the second thermal deformation media are thermally deformed in the longitudinal direction.

In the display device according to embodiments of the present specification, the porous thermal insulation foam is disposed below the second thermal deformation medium, which provides an effect of inhibiting the heat absorbed by the second thermal deformation medium from being transferred to the display module.

In the display device according to embodiments of the present specification, the creased area is included in a partial area of the second thermal deformation medium, such that an air fraction between the creased area and the thermal insulation foam increases, which provides an effect of inhibiting the heat absorbed by the second thermal deformation medium from being transferred to the display module.

The effects achieved by the display device according to embodiments of the present specification are not limited to the above-mentioned effects, and more various effects are included in the present specification.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
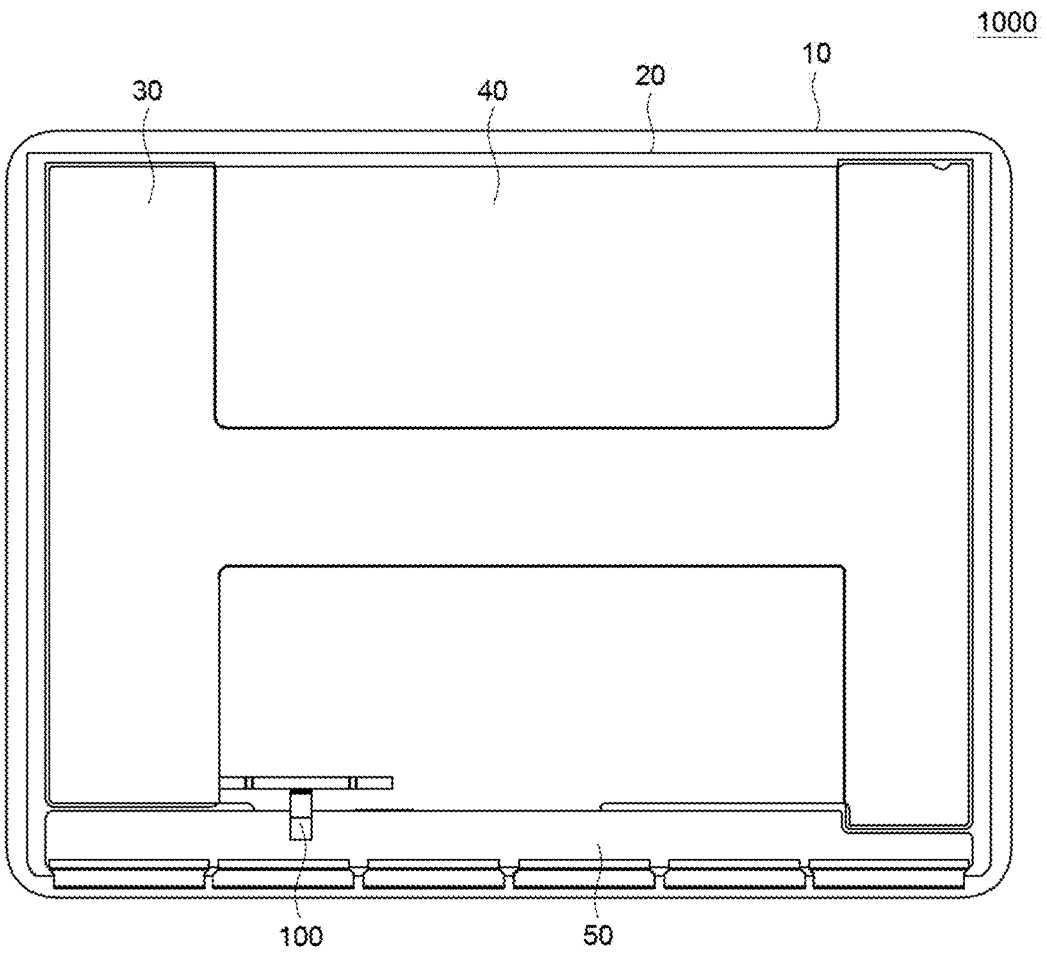
FIG. 1 is a schematic rear view of a display device according to the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the disclosure, a detailed explanation of known related present technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
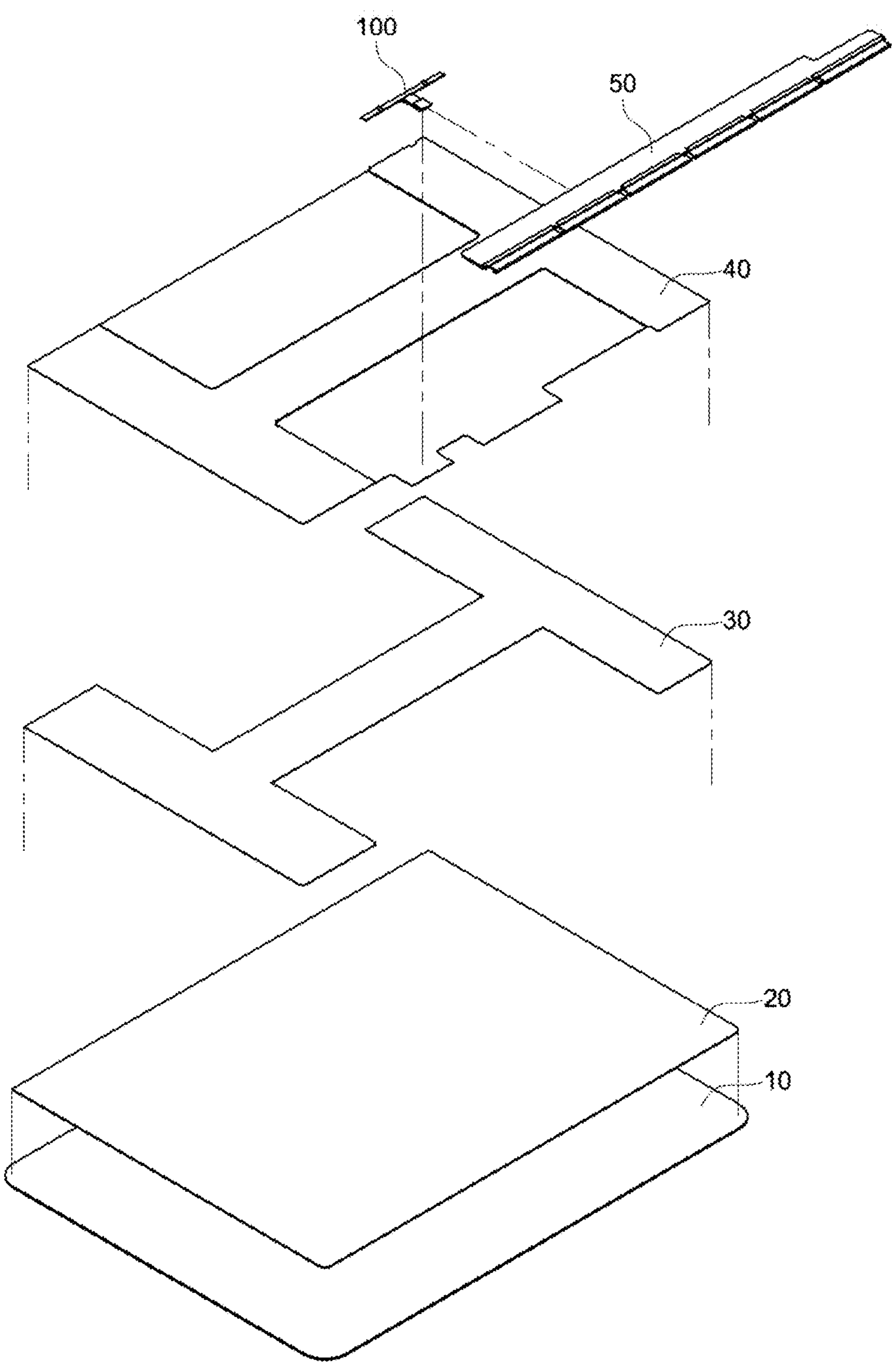
FIG. 2 is an exploded perspective view of FIG. 1.

FIG. 1 is a schematic rear view of a display device according to the present disclosure, and FIG. 2 is an exploded perspective view of FIG. 1.

With reference to FIGS. 1 and 2, a display device 1000 according to the present disclosure includes a cover glass 10, a display panel 20, a reinforcement plate 30, a heat dissipation sheet 40, a circuit component 50, and a heat dissipation module 100.

The cover glass 10 has a shape corresponding to the display panel 20. The cover glass 10 is disposed to cover a front surface of the display panel 20. The cover glass 10 protects the display panel 20 from external impact, moisture, heat, or the like. The cover glass 10 may be made of a tempered glass material. However, the present specification is not limited thereto.

The display panel 20 is configured to display images to a user and includes a plurality of subpixels. In the display panel 20, a plurality of scan lines and a plurality of data lines may intersect one another, and each of the plurality of subpixels is connected to the scan line and the data line. Each of the plurality of scan lines may be configured to extend in a first direction. Each of the plurality of data lines may be configured to extend in a second direction different from the first direction. The plurality of subpixels may be respectively connected to a high-potential power line, a low-potential power line, a reference line, and the like. Embodiments are not limited thereto. As an example, one of more signal wirings, such as a sensing line, an emission controlling line etc., may be further included.

The display panel 20 has a display area that is an area of the display device 1000 in which images are displayed. The display area may include the plurality of subpixels configured to constitute a plurality of pixels, and a circuit configured to operate the plurality of subpixels. The plurality of subpixels is minimum units that constitute the display area. The n subpixels may constitute a single pixel. A light-emitting element, a thin-film transistor for operating the light-emitting element, and the like may be disposed in each of the plurality of subpixels. The plurality of light-emitting elements may be differently defined depending on the type of the display panel 20. For example, in case that the display panel 20 is an organic light-emitting display panel, the light-emitting element may be an organic light-emitting diode (OLED). However, the present disclosure is not limited thereto. In another example, in case that the display panel 20 is an inorganic light-emitting display panel, the light-emitting element may be inorganic material-based light-emitting diode.

The reinforcement plate 30 is disposed below the display panel 20 and supports the display panel 20. The reinforcement plate may be referred to as stiffener. In one embodiment, the reinforcement plate 30 is made of stainless steel (SUS) and suppresses deformation of the display panel 20. For example, the reinforcement plate 30 may be made of alloy steel such as ferrite, martensite, austenite, duplex, or high-nitrogen powder metallurgy stainless. However, the present specification is not limited thereto.

The heat dissipation sheet 40 is disposed below the reinforcement plate 30. The heat dissipation sheet 40 may include an electrically conductive material having high thermal conductivity and protect a rear surface of the display panel 20 while performing a heat dissipation function. The heat dissipation sheet 40 may be made of various electrically conductive materials, for example, a metallic material with excellent thermal conductivity. The heat dissipation sheet 40 may be made of a material including aluminum (Al) or copper (Cu). However, the present specification is not limited thereto. The heat dissipation sheet 40 may be made of a graphite material. A thickness of the heat dissipation sheet 40 may be about 100 to 300 μm to perform an effective heat dissipation function. However, the present disclosure is not limited thereto. The heat dissipation sheet 40 may have an embossed pattern having a shape corresponding to a shape of the reinforcement plate 30, and the reinforcement plate 30 may be positioned in the embossed pattern of the heat dissipation sheet 40.

The circuit component 50 operates the display panel 20. The circuit component 50 includes a printed circuit board (PCB) 53, and a driver IC (D-IC) 51 mounted on the board 53. The driver IC 51 includes a data driver IC and a gate driver IC. The data driver IC may be a circuit for driving the plurality of data lines, and can supply data signals to the plurality of data lines. The gate driver IC may be a circuit for driving a plurality of gate lines, and can supply gate signals to the plurality of gate lines.

The driver IC 51 may further include a timing controller configured to control the data driver IC and the gate driver IC, and can control driving times for the plurality of data lines and driving times for the plurality of gate lines.

The timing controller aligns image data inputted from the outside and supplies the image data to the driver IC 51. The timing controller may generate gate control signals and data control signals by using synchronizing signals, i.e., dot clock signals, data enable signals, and horizontal/vertical synchronizing signals inputted from the outside. The timing controller controls the driver IC 51 by supplying the generated gate control signals and data control signals to the gate driver IC and the data driver IC.

The driver IC 51 is connected to the display panel 20. The driver IC 51 receives the data signal and the gate signal in response to a control signal from the timing controller and operates the display panel 20 on the basis of the received data signal and gate signal.

The circuit component 50 may be disposed in a non-display area of the display panel 20. However, the present disclosure is not limited thereto.

The display area may be defined as an area in which images are displayed. The non-display area may be defined as an area in which no image is displayed, i.e., an area extending from the display area. A link line and a pad electrode may be further disposed in the non-display area to transmit signals to the subpixels in the display area. The non-display area may be positioned on the rear surface of the display panel 20, i.e., a surface on which no subpixel is present. Alternatively, the non-display area may be excluded. The non-display area may be also referred to as an edge area or a bezel area. As an example, the bezel area may be bent from the active area toward the rear surface of the display panel, without being limited thereto. As an example, the bezel area may be bent from the active area toward the rear side of the display panel, such that at least a portion or an entirety of the bezel area cannot be seen from the front side of the display panel.

In general, high-temperature heat is generated from the circuit component 50 when the display panel 20 operates. In particular, high-temperature heat is generated from the driver IC 51. In the display device 1000 in the related art, the heat dissipation sheet 40 is disposed to transfer the heat, which is generated from the circuit component, to the heat dissipation sheet 40, so that the heat is conducted and discharged through the heat dissipation sheet 40.

However, in case that only the heat dissipation sheet 40 is used to cope with the heat generation, the heat generation causes a high-temperature peak around the circuit component 50 disposed below the display device 1000, and temperature uniformity implemented by the thermal conduction in the heat dissipation sheet 40 cannot be ensured.

The display device 1000 according to the present disclosure further includes the heat dissipation module 100 configured to connect the circuit component 50 and the reinforcement plate 30 and transfer heat from the circuit component 50 to the reinforcement plate 30, such that the heat generated from the circuit component 50 is more easily diffused to left and right sides of the heat dissipation sheet 40. Therefore, the temperature uniformity implemented by the thermal conduction in the heat dissipation sheet 40 is improved, and the generated heat is more easily diffused to the left and right sides of the heat dissipation sheet 40.

Figure 3:
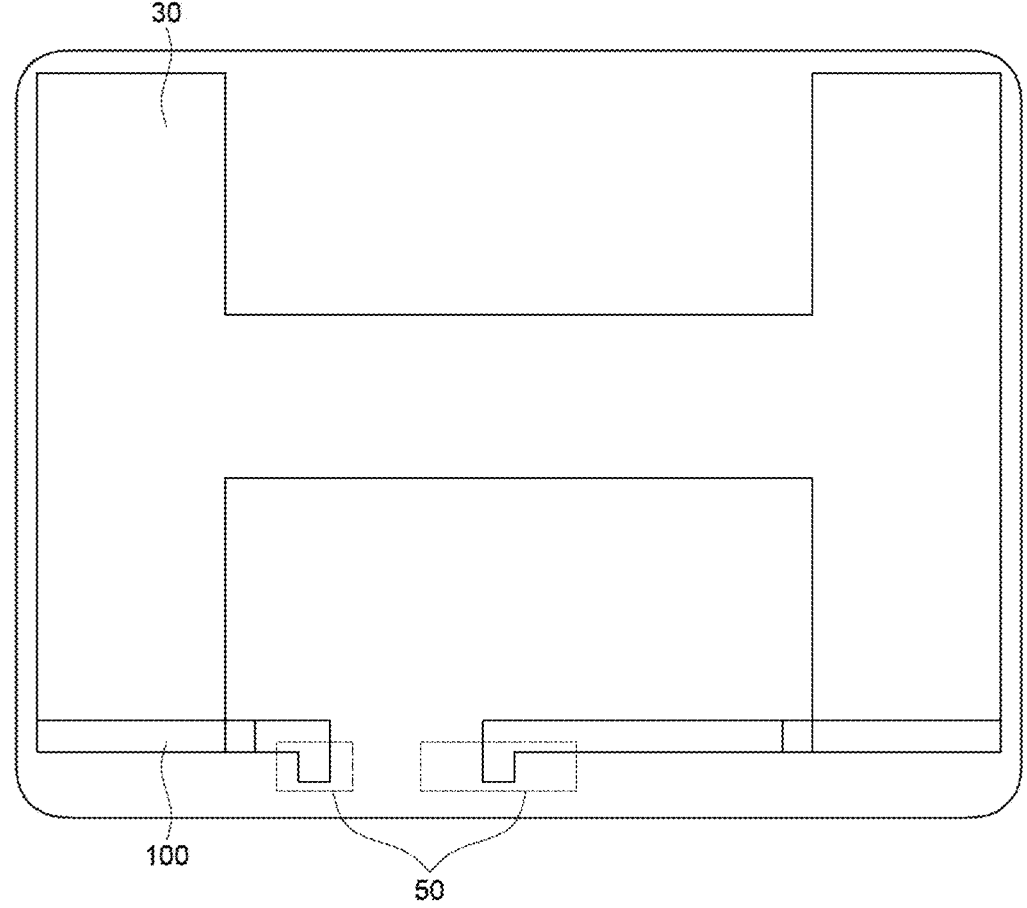
FIG. 3 is a rear view illustrating a state in which a heat dissipation module according to the present disclosure connects a circuit component and a reinforcement plate.
Figure 4:
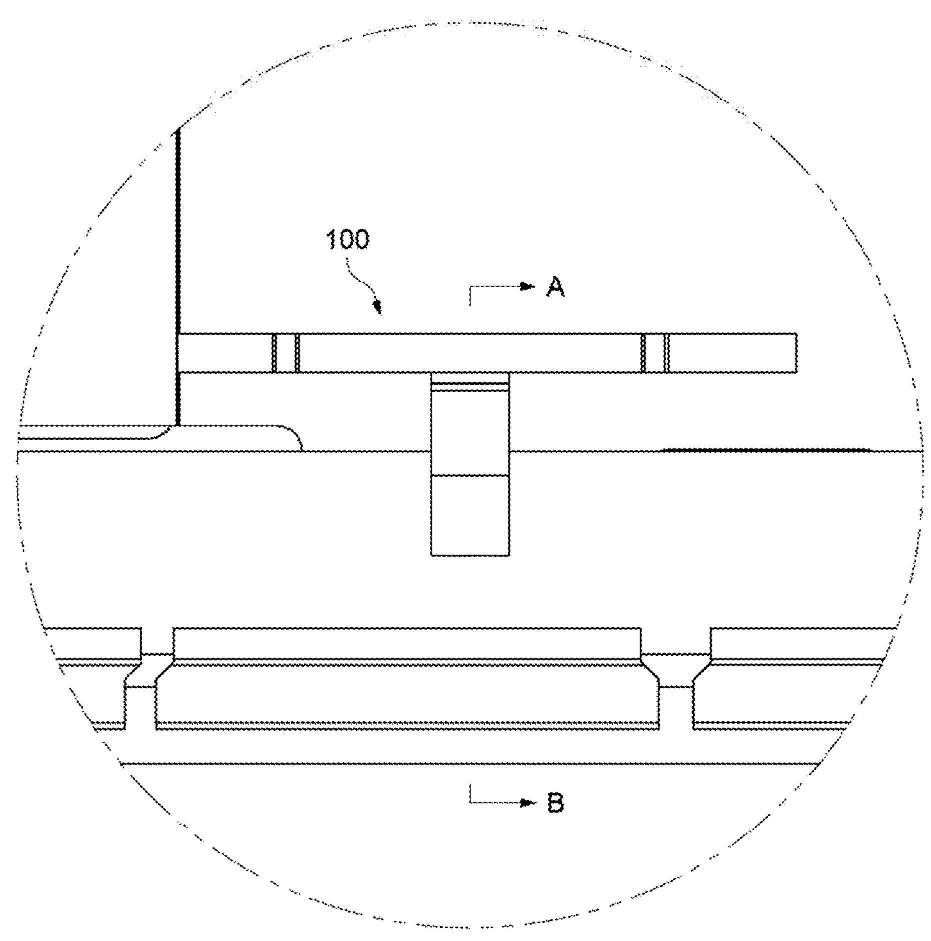
FIG. 4 is an enlarged view of FIG. 1 and illustrates a state in which the heat dissipation module according to the present disclosure connects the circuit component and a heat dissipation sheet.

FIG. 3 is a rear view illustrating a state in which the heat dissipation module according to the present disclosure connects the circuit component and the reinforcement plate, and FIG. 4 is an enlarged view of FIG. 1 and illustrates a state in which the heat dissipation module according to the present disclosure connects the circuit component and the heat dissipation sheet.

As illustrated in FIG. 3, the heat dissipation module 100 according to the embodiment of the present disclosure is connected to the circuit component 50 and the reinforcement plate 30. Alternatively, as illustrated in FIGS. 1 and 4, the heat dissipation module 100 according to another embodiment of the present disclosure is connected to the circuit component 50 and the heat dissipation sheet 40. The heat dissipation module 100 may be connected to the heat dissipation sheet 40, i.e., a portion in the heat dissipation sheet 40 where the reinforcement plate 30 is positioned, and the heat dissipation module 100 may absorb the heat generated from the circuit component 50 and transfer the heat, which is absorbed from the circuit component 50, to the reinforcement plate 30 through the heat dissipation sheet 40.

The heat dissipation module 100 may absorb the heat generated from the circuit component 50 and transfer the absorbed heat to the reinforcement plate 30 through the heat dissipation sheet 40, thereby reducing or minimizing the occurrence of thermal stress in the circuit component 50 and the reinforcement plate 30 by absorbing heat, which is generated from the circuit component 50, and transferring the heat to the reinforcement plate 30.

Figure 5:
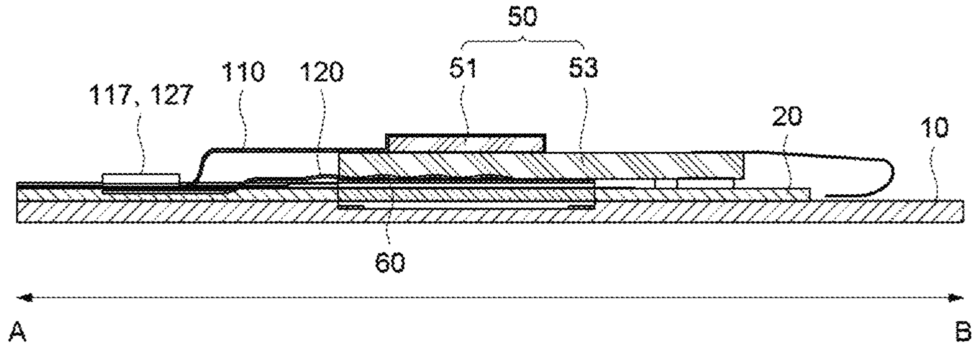
FIG. 5 is a cross-sectional view taken along line A-B in FIG. 4 and illustrates a state in which the heat dissipation module according to the present disclosure is stacked.
Figure 6:
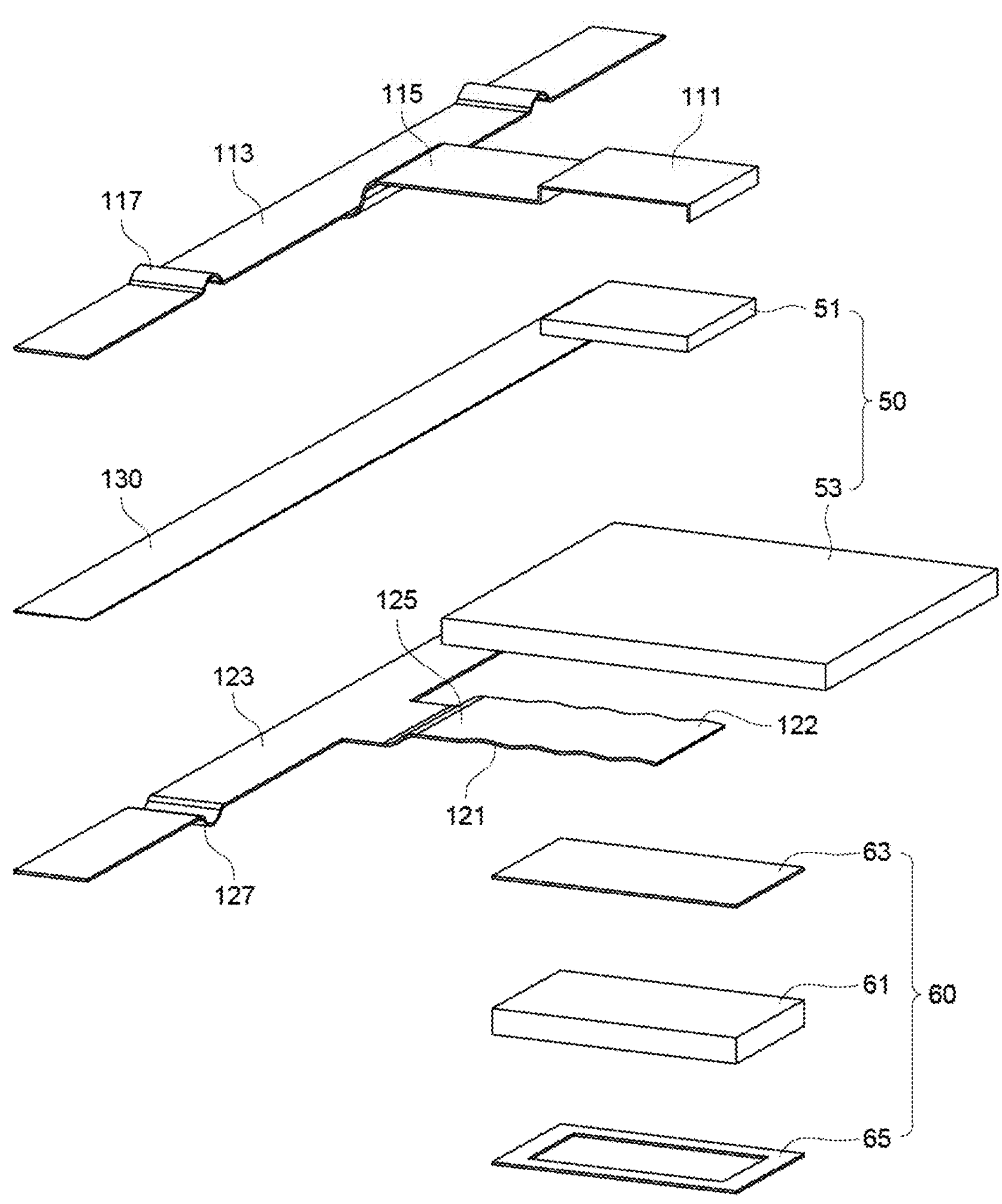
FIG. 6 is an exploded perspective view of FIG. 5.
Figure 8:
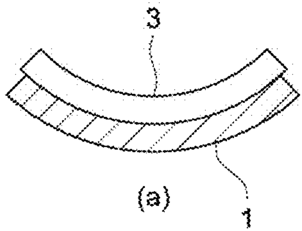
FIGS. 8 and 9 are schematic views illustrating a margin structure according to the present disclosure.
Figure 8:
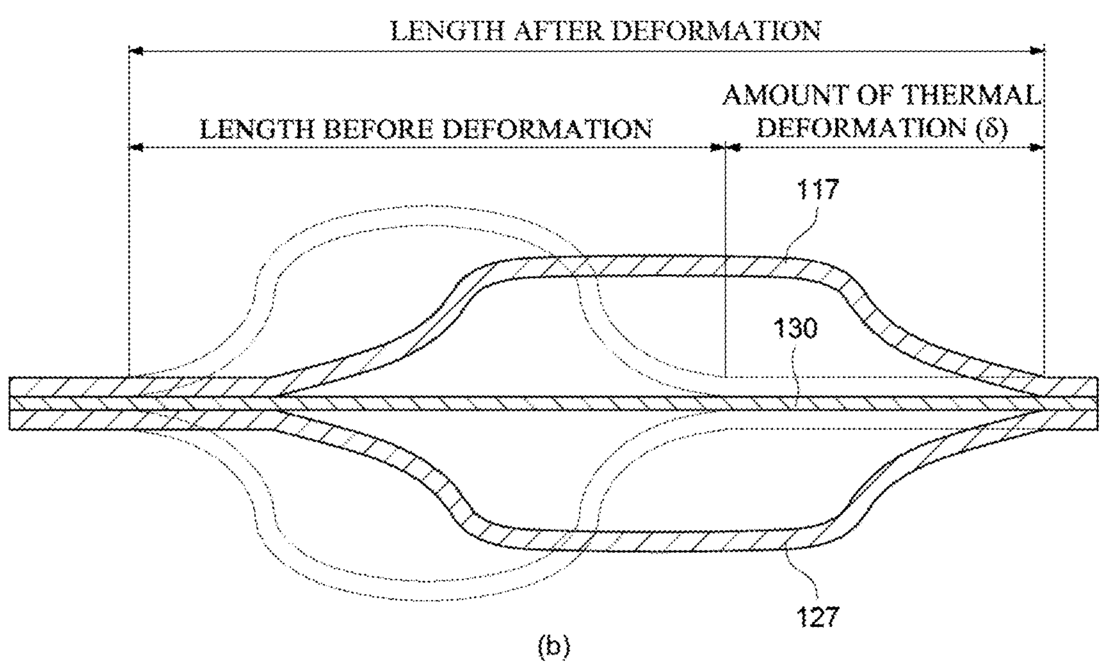
Figure 9:
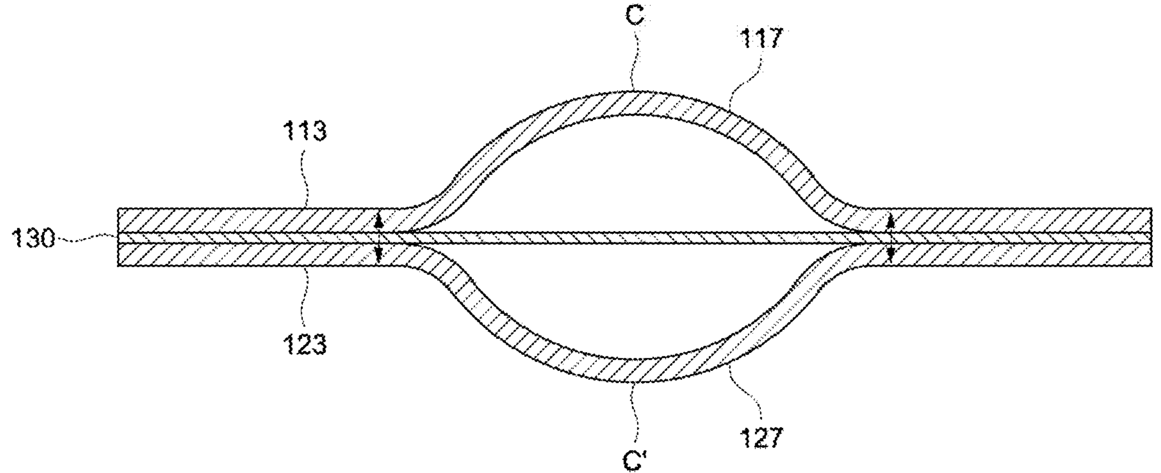

FIG. 5 is a cross-sectional view taken along line A-B in FIG. 4 and illustrates a state in which the heat dissipation module according to the present disclosure is stacked, and FIG. 6 is an exploded perspective view of FIG. 5. Further, FIG. 7 is a schematic view illustrating a state in which the heat dissipation module 100 is stacked, and FIGS. 8 and 9 are schematic views illustrating margin structures 117 and 127 according to the present disclosure.

Figure 7:
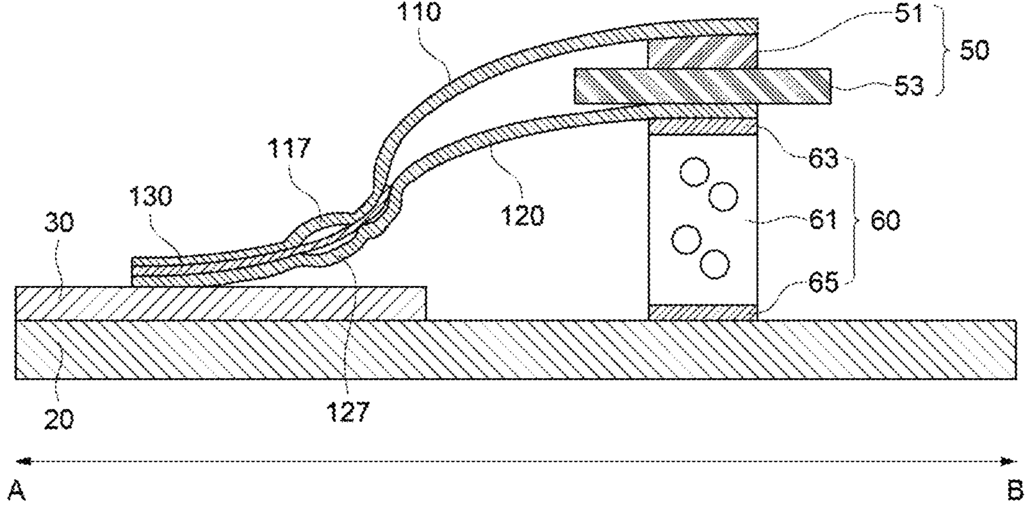
FIG. 7 is a schematic view illustrating a state in which the heat dissipation module according to the present disclosure is stacked.

With reference to FIGS. 5 to 7 first, the heat dissipation module 100 according to the present disclosure includes a first thermal deformation medium 110, a second thermal deformation medium 120, and a thermal conduction medium 130. The thermal conduction medium 130 may be configured to transfer the heat between the first thermal deformation medium 110 and the second thermal deformation medium 120. The first thermal deformation medium 110 and the second thermal deformation medium 120 adjoin the circuit component 50 and absorb heat generated from the circuit component 50. Specifically, the first thermal deformation medium 110 adjoins the driver IC (D-IC) 51 of the circuit component 50, and the second thermal deformation medium 120 adjoins the printed circuit board 53 of the circuit component 50. The first thermal deformation medium 110 and the second thermal deformation medium 120 absorb heat generated from the circuit component 50, thereby reducing or minimizing the occurrence of thermal stress in the circuit component 50. The thermal conduction medium 130 is disposed between the first thermal deformation medium 110 and the second thermal deformation medium 120 and exchanges and transfers heat between the first thermal deformation medium 110 and the second thermal deformation medium 120.

As described above, the circuit component 50 includes the driver IC 51 configured to operate the display panel 20, and the printed circuit board 53 on which the driver IC 51 is mounted.

The first thermal deformation medium 110 adjoins the driver IC 51 of the circuit component 50. In one embodiment, the first thermal deformation medium 110 adjoins a top surface and at least any one side surface of the driver IC 51. In one embodiment, the first thermal deformation medium 110 is formed to surround the top surface and at least any one side surface of the driver IC 51. The first thermal deformation medium 110 absorbs heat from the driver IC 51. The first thermal deformation medium 110 absorbs the heat generated from the driver IC 51 and transfers the heat, which is absorbed from the driver IC 51, to the reinforcement plate 30, thereby reducing or minimizing the occurrence of thermal stress in the driver IC 51, the board 53 of the circuit component 50, and the reinforcement plate 30.

The second thermal deformation medium 120 adjoins the printed circuit board 53 of the circuit component 50. In one embodiment, the second thermal deformation medium 120 adjoins a bottom surface of a board 53. In detail, a top surface of the second thermal deformation medium 120 adjoins the bottom surface of the board 53. The second thermal deformation medium 120 absorbs heat from the board 53. The second thermal deformation medium 120 transfers the absorbed heat to the reinforcement plate 30, thereby reducing or minimizing the occurrence of thermal stress in the driver IC 51, the board 53 of the circuit component 50, and the reinforcement plate 30.

The thermal conduction medium 130 is disposed between a predetermined zone of the first thermal deformation medium 110 and a predetermined zone of the second thermal deformation medium 120. However, the present disclosure is not limited thereto. In the predetermined zone, the thermal conduction medium 130 transfers heat between the first thermal deformation medium 110 and the second thermal deformation medium 120 and exchanges heat.

The first thermal deformation medium 110 and the second thermal deformation medium 120 are thermally deformed together by heat exchange, thereby reducing or minimizing the occurrence of thermal stress in the driver IC 51, the board 53, of the circuit component 50 and the reinforcement plate 30.

In detail, the first thermal deformation medium 110 includes a first absorption portion 111, a first transfer portion 113, and a first connection portion 115. The first absorption portion 111 adjoins the top surface and at least one side surface of the driver IC 51 and absorbs heat from the driver IC 51. One end of the first transfer portion 113 is connected to the reinforcement plate 30 and transfers the heat, which is absorbed by the first absorption portion 111, to the reinforcement plate 30. According to the embodiment, one end of the first transfer portion 113 may be connected to the heat dissipation sheet 40 that covers an upper portion of the reinforcement plate 30. The first transfer portion 113 may transfer heat to the heat dissipation sheet 40 that covers the upper portion of the reinforcement plate 30. The heat, which is transferred to the heat dissipation sheet 40 that covers the reinforcement plate 30, may be transferred to the reinforcement plate 30 positioned below the heat dissipation sheet 40. The first connection portion 115 connects the first absorption portion 111 and the first transfer portion 113. The heat, which is absorbed from the driver IC 51 by the first absorption portion 111, is conducted to the first transfer portion 113 via the first connection portion 115, and the heat conducted to the first transfer portion 113 is transferred to the heat dissipation sheet 40 that covers the upper portion of the reinforcement plate 30, and then transferred to the reinforcement plate 30 positioned below the heat dissipation sheet 40.

In detail, the second thermal deformation medium 120 includes a second absorption portion 121, a second transfer portion 123, and a second connection portion 125. The second absorption portion 121 adjoins the bottom surface of the board 53 and absorbs heat from the board 53. One end of the second transfer portion 123 is connected to the reinforcement plate 30 and transfers the heat, which is absorbed by the second absorption portion 121, to the reinforcement plate 30. According to the embodiment, one end of the second transfer portion 123 may be connected to the heat dissipation sheet 40 that covers the upper portion of the reinforcement plate 30. The second transfer portion 123 may transfer heat to the heat dissipation sheet 40 that covers the upper portion of the reinforcement plate 30. The heat, which is transferred to the heat dissipation sheet 40 that covers the reinforcement plate 30, may be transferred to the reinforcement plate 30 positioned below the heat dissipation sheet 40. The second connection portion 125 connects the second absorption portion 121 and the second transfer portion 123. The heat, which is absorbed from the board 53 by the second absorption portion 121, is conducted to the second transfer portion 123 via the second connection portion 125, and the heat conducted to the second transfer portion 123 is transferred to the heat dissipation sheet 40 that covers the upper portion of the reinforcement plate 30, and then transferred to the reinforcement plate 30 positioned below the heat dissipation sheet 40.

In one embodiment, the first thermal deformation medium 110 and the second thermal deformation medium 120 may be made of the same material. In contrast, the thermal conduction medium 130 is made of a material different from the material of the first thermal deformation medium 110 and the second thermal deformation medium 120. In this case, the thermal conduction medium 130 has a coefficient of thermal expansion or a coefficient of heat transfer higher than a coefficient of thermal expansion or a coefficient of heat transfer of the first thermal deformation medium 110 and the second thermal deformation medium 120 and thus improves the heat transfer between the first thermal deformation medium 110 and the second thermal deformation medium 120 rather than the thermal conduction through each of the first thermal deformation medium 110 and the second thermal deformation medium 120. A balance of temperature between the first thermal deformation medium 110 and the second thermal deformation medium 120 is implemented.

The first thermal deformation medium 110 and the second thermal deformation medium 120 may be thermally deformed by the heat absorbed from the circuit component 50. In case that there is a difference between the heat absorbed from the circuit component 50 by the first thermal deformation medium 110 and the heat absorbed from the circuit component 50 by the second thermal deformation medium 120, e.g., in case that the first thermal deformation medium 110 absorbs heat with a temperature higher than a temperature of the heat absorbed by the second thermal deformation medium 120 from the circuit component 50, the first thermal deformation medium 110 may be thermally deformed to a larger degree than the second thermal deformation medium 120. For example, in case that a first thermal deformation medium 1 (FIG. 8(*a*)) is thermally deformed to a larger degree than a second thermal deformation medium 3 (FIG. 8(*a*)), the first thermal deformation medium 1 and the second thermal deformation medium 3 may be thermally deformed in a shape bent in an arc shape in one direction, as illustrated in FIG. 8(*a*). As illustrated in FIG. 8(*a*), in case that the first thermal deformation medium 1 and the second thermal deformation medium 3 are thermally deformed in an arc shape, the first thermal deformation medium 1 and the second thermal deformation medium 3 are damaged by the thermal deformation thereof.

As described above, the thermal conduction medium 130 according to the present disclosure exchange and transfer heat between the first thermal deformation medium 110 and the second thermal deformation medium 120, thereby adjusting a balance of heat between the first thermal deformation medium 110 and the second thermal deformation medium 120. The thermal conduction medium 130 has a coefficient of heat transfer higher than a coefficient of heat transfer of the first thermal deformation medium 110 and the second thermal deformation medium 120. Therefore, in case that the first thermal deformation medium 110 absorbs heat with a temperature higher than a temperature of the heat absorbed by the second thermal deformation medium 120 from the circuit component 50, the heat absorbed by the first thermal deformation medium 110 is transferred to the thermal conduction medium 130 instead of being conducted in a longitudinal direction of the first thermal deformation medium 110, and the heat transferred to the thermal conduction medium 130 is transferred to the second thermal deformation medium 120. That is, the thermal conduction medium 130 improves the heat transfer between the first thermal deformation medium 110 and the second thermal deformation medium 120 rather than the thermal conduction through each of the first thermal deformation medium 110 and the second thermal deformation medium 120.

The thermal conduction medium 130 exchanges heat between the first thermal deformation medium 110 and the second thermal deformation medium 120. Because the heat is exchanged by the thermal conduction medium 130 between the first thermal deformation medium 110 and the second thermal deformation medium 120, a balance of temperature between the first thermal deformation medium 110 and the second thermal deformation medium 120 is implemented. The first thermal deformation medium 110 and the second thermal deformation medium 120, which are balanced in temperature may be thermally deformed together and stretched in the longitudinal direction. Therefore, the first thermal deformation medium 110 and the second thermal deformation medium 120 may be stretched in the longitudinal direction without being bent when the heat is absorbed from the circuit component 50.

That is, the heat dissipation module 100 according to the present disclosure has a triple structure including the first thermal deformation medium 110, the thermal conduction medium 130 disposed between the first thermal deformation medium 110 and the second thermal deformation medium 120, and the second thermal deformation medium 120, such that the heat dissipation module 100 is stretched in the longitudinal direction without being bent by the thermal deformation.

As described above, the thermal conduction medium 130 is disposed between a predetermined zone of the first thermal deformation medium 110 and a predetermined zone of the second thermal deformation medium 120. In this case, according to the embodiment, the thermal conduction medium 130 may be disposed in the first transfer portion 113 and the second transfer portion 123. However, the present disclosure is not limited thereto. The thermal conduction medium 130 disposed in the first transfer portion 113 and the second transfer portion 123 has a coefficient of heat transfer higher than a coefficient of heat transfer of the first thermal deformation medium 110 and the second thermal deformation medium 120. Specifically, the thermal conduction medium 130 disposed in the first transfer portion 113 and the second transfer portion 123 has a coefficient of heat transfer higher than a coefficient of heat transfer of the first transfer portion 113 and the second transfer portion 123. Therefore, the thermal conduction medium 130 exchanges heat between the first transfer portion 113 and the second transfer portion 123. That is, the thermal conduction medium 130 improves the heat transfer between the first transfer portion 113 and the second transfer portion 123. The thermal conduction medium 130 exchanges heat between the first transfer portion 113 and the second transfer portion 123 and thermally deforms the first transfer portion 113 and the second transfer portion 123 together in the longitudinal direction of the first transfer portion 113 and the second transfer portion 123.

As described above, high-temperature heat is generated from the driver IC 51. Therefore, the first thermal deformation medium 110 connected directly to the driver IC 51 absorbs heat with a temperature higher than a temperature of the heat absorbed by the second thermal deformation medium 120 connected directly to the board 53. The thermal conduction medium 130 disposed in the first transfer portion 113 and the second transfer portion 123 exchanges heat between the first thermal deformation medium 110 and the second thermal deformation medium 120 by exchanging heat conducted to the first transfer portion 113 and the second transfer portion 123, a balance of temperature between the first thermal deformation medium 110 and the second thermal deformation medium 120 is implemented. The first transfer portion 113 and the second transfer portion 123, which are balanced in temperature by the thermal conduction medium 130, are thermally deformed together in the longitudinal direction. Therefore, the first transfer portion 113 and the second transfer portion 123 may be stretched in the longitudinal direction without being bent when the heat is absorbed from the circuit component 50.

With reference to FIG. 8(*b*), the first thermal deformation medium 110 and the second thermal deformation medium 120 according to the present disclosure respectively include the margin structures 117 and 127 each having a shape that may be freely extended when being stretched in the longitudinal direction. With reference to FIG. 9, the margin structures 117 and 127 have a shape in which centers C and C' are distant from each other in a direction in which the centers C and C' face each other so that an internal space is provided between the first thermal deformation medium 110 and the second thermal deformation medium 120. The margin structures 117 and 127 are stretched when the first thermal deformation medium 110 and the second thermal deformation medium 120 are thermally deformed by absorbing heat generated from the circuit component such that damage to the first thermal deformation medium 110 and the second thermal deformation medium 120 caused by the thermal deformation is suppressed.

The margin structures 117 and 127 of the first thermal deformation medium 110 and the second thermal deformation medium 120 are disposed to be symmetric so that the centers C and C' are positioned on the same line. In the margin structures 117 and 127 of the first thermal deformation medium 110 and the second thermal deformation medium 120 disposed so that the centers C and C' of the margin structures 117 and 127 of the first thermal deformation medium 110 and the second thermal deformation medium 120 are positioned on the same line, the first thermal deformation medium 110 and the second thermal deformation medium 120 are spaced apart from the thermal conduction medium 130 at a predetermined interval. In the margin structures 117 and 127, the first thermal deformation medium 110 and the second thermal deformation medium 120 are spaced apart from the thermal conduction medium 130 at a predetermined interval, such that no heat exchange occurs. Specifically, in the margin structures 117 and 127, the first transfer portion 113 and the second transfer portion 123 are spaced apart from the thermal conduction medium 130 at a predetermined interval, such that no heat exchange occurs. Therefore, in the margin structures 117 and 127, the first thermal deformation medium 110 and the second thermal deformation medium 120 are freely thermally deformed, which may suppress damage to the first thermal deformation medium 110 and the second thermal deformation medium 120 caused by thermal deformation.

The margin structures 117 and 127 included in the first thermal deformation medium 110 and the second thermal deformation medium 120 may be disposed on the first transfer portion 113 and the second transfer portion 123. The first transfer portion 113 and the second transfer portion 123 include the margin structures 117 and 127 that define a shape in which the centers are distant in a direction in which the centers are opposite to each other so that an internal space is provided. The margin structures 117 and 127 may be stretched when the first thermal deformation medium 110 and the second thermal deformation medium 120 are thermally deformed by absorbing heat generated from the circuit component 50 such that damage to the first thermal deformation medium 110 and the second thermal deformation medium 120 caused by the thermal deformation can be suppressed.

As described above, the thermal conduction medium 130 is disposed between the first transfer portion 113 and the second transfer portion 123. The first transfer portion 113 and the second transfer portion 123 exchange heat through the thermal conduction medium 130, and the first transfer portion 113 and the second transfer portion 123 are stretched together in the longitudinal direction by the heat absorbed from the circuit component 50 by the first absorption portion 111 and the second absorption portion 121. In the margin structures 117 and 127, the first transfer portion 113 and the second transfer portion 123 are spaced apart from the thermal conduction medium 130 at a predetermined interval, such that no heat exchange occurs. When the first transfer portion 113 and the second transfer portion 123 are stretched together in the longitudinal direction, the first transfer portion 113 and the second transfer portion 123 are freely thermally deformed in the margin structures 117 and 127. Therefore, even though the first transfer portion 113 and the second transfer portion 123 are thermally deformed, damage to the first transfer portion 113 and the second transfer portion 123 caused by thermal deformation is suppressed.

In summary, the heat dissipation module 100 of the display device 1000 according to the present disclosure includes the first thermal deformation medium 110 and the second thermal deformation medium 120 configured to absorb heat from the circuit component 50 configured to operate the display panel 20, and the thermal conduction medium 130 disposed between the first thermal deformation medium 110 and the second thermal deformation medium 120 and configured to exchange the heat absorbed by the first thermal deformation medium 110 and the second thermal deformation medium 120. Because the heat is exchanged between the first thermal deformation medium 110 and the second thermal deformation medium 120 by the thermal conduction medium 130, the first thermal deformation medium 110 and the second thermal deformation medium 120 may be thermally deformed together in the longitudinal direction, in which the first thermal deformation medium 110 and the second thermal deformation medium 120 are formed, without being bent. In addition, the margin structures 117 and 127, which are spaced apart from the thermal conduction medium 130 at a predetermined interval, may be included in the predetermined zones of the first thermal deformation medium 110 and the second thermal deformation medium 120, and the first thermal deformation medium 110 and the second thermal deformation medium 120 may be freely stretched in the margin structures 117 and 127, which may suppress damage to the first thermal deformation medium 110 and the second thermal deformation medium 120 caused by thermal deformation even though the first thermal deformation medium 110 and the second thermal deformation medium 120 are thermally deformed.

With reference back to FIGS. 5 to 7, the thermal insulation foam layer 60 may include a thermal insulation foam 61, the thermal insulation foam 61 may be further disposed below the circuit component 50 and the second thermal deformation medium 120 to thermally insulate heat toward the display panel 20. At least a partial area of the second thermal deformation medium 120 adjoins a bottom surface of the circuit component 50. Specifically, at least a partial area of the second thermal deformation medium 120 adjoins a bottom surface the board 53 of of the circuit component 50. The thermal insulation foam 61 is disposed at a lower side of a partial area at which the second thermal deformation medium 120 adjoins the bottom surface of the circuit component 50. The thermal insulation foam 61 includes a plurality of pores. The thermal insulation foam 61 inhibits the heat, which is absorbed from the circuit component 50 by the second thermal deformation medium 120, from being conducted toward the display panel 20. Therefore, the heat, which is absorbed from the circuit component 50 by the second thermal deformation medium 120, is conducted in the longitudinal direction of the second thermal deformation medium 120 and transferred to the reinforcement plate 30 without moving toward the display panel 20.

In detail, in one embodiment, a thermal insulation foam layer 60 is disposed on a bottom surface of the second absorption portion 121 to thermally insulate heat toward the display panel 20. Specifically, the thermal insulation foam 61 may be disposed on a bottom surface of the second absorption portion 121 to thermally insulate heat toward the display panel 20. The thermal insulation foam layer 60 inhibits the heat, which is absorbed from the board 53 by the second absorption portion 121, from being conducted toward the display panel 20. Therefore, the heat, which is absorbed from the board 53 by the second absorption portion 121, is conducted in the longitudinal direction of the second thermal deformation medium 120, i.e., conducted to the second connection portion 125 and the second transfer portion 123 without moving toward the display panel 20. The heat conducted to the second transfer portion 123 is exchanged with the first transfer portion 113 by the thermal conduction medium 130.

The thermal insulation foam layer 60 further includes first bonding layer 63 and second bonding layer 65 configured to bond the thermal insulation foam 61 to the second absorption portion 121 and the display panel 20. The first bonding layer 63 is disposed above the thermal insulation foam 61. The first bonding layer 63 bonds a top surface of the thermal insulation foam 61 to a bottom surface of the second absorption portion 121. The second bonding layer 65 is disposed below the thermal insulation foam 61. The second bonding layer 65 bonds the thermal insulation foam 61 to the display panel 20. Specifically, the second bonding layer 65 bonds a bottom surface of the thermal insulation foam 61 to a top surface of the display panel 20. A central portion of the second bonding layer 65 may be configured as an empty space to thermally insulate the thermal insulation foam 61 and the display panel 20.

The heat, which is absorbed from the board 53 by the second absorption portion 121, is thermally insulated by the thermal insulation foam layer 60 in a vertical direction toward the display panel 20. Therefore, the heat, which is absorbed from the board 53 by the second absorption portion 121, is dissipated only in a horizontal direction toward the second connection portion 125 and the second transfer portion 123. The heat, which is dissipated to the second transfer portion 123, is exchanged with the first transfer portion 113 by the thermal conduction medium 130, and the first transfer portion 113 and the second transfer portion 123 are stretched in the longitudinal direction thereof and freely stretched in the margin structures 117 and 127, thereby suppressing damage to the first transfer portion 113 and the second transfer portion 123 caused by thermal deformation.

The first bonding layer 63 and the second bonding layer 65 may each be a pressure sensitive adhesive (PSA) that minimizes or reduces the occurrence of foreign substances or bubbles. However, the present specification is not limited thereto.

In addition, a partial area of the second thermal deformation medium 120, which adjoins the bottom surface of the circuit component 50, further includes a creased area 122 having a creased shape. The creased area 122 of the second thermal deformation medium 120 increases an air fraction between a partial area of the second thermal deformation medium 120 and the thermal insulation foam 61. The heat, which is absorbed by the second thermal deformation medium 120, further thermally insulated by the creased area 122 by air present between the second thermal deformation medium 120 and the thermal insulation foam 61. Therefore, the heat absorbed by the second thermal deformation medium 120 is conducted along the second thermal deformation medium 120 without being conducted toward the display panel 20. Therefore, the heat absorbed by the second thermal deformation medium 120 is transferred to the reinforcement plate 30. That is, the creased area 122 reduces or minimizes the amount of heat transfer toward the display panel 20 by increasing an air present between the second thermal deformation medium 120 and the thermal insulation foam 61 and reducing an overall coefficient of heat transfer.

In detail, the second absorption portion 121 has the creased area 122 having at least a partial area with a creased shape. The creased area 122 of the second absorption portion 121 increases an air fraction between at least a partial area of the second absorption portion 121 and the thermal insulation foam 61. The creased area 122 of the second absorption portion 121 may reduce or minimize the amount of heat transfer toward the display panel 20 by increasing an air fraction between the second absorption portion 121 and the thermal insulation foam 61. That is, the creased area 122 reduces the amount of heat transfer toward the display panel 20 by increasing an air fraction between the second absorption portion 121 and the thermal insulation foam layer 60 and reducing or minimizes an overall coefficient of heat transfer.

Figure 10:
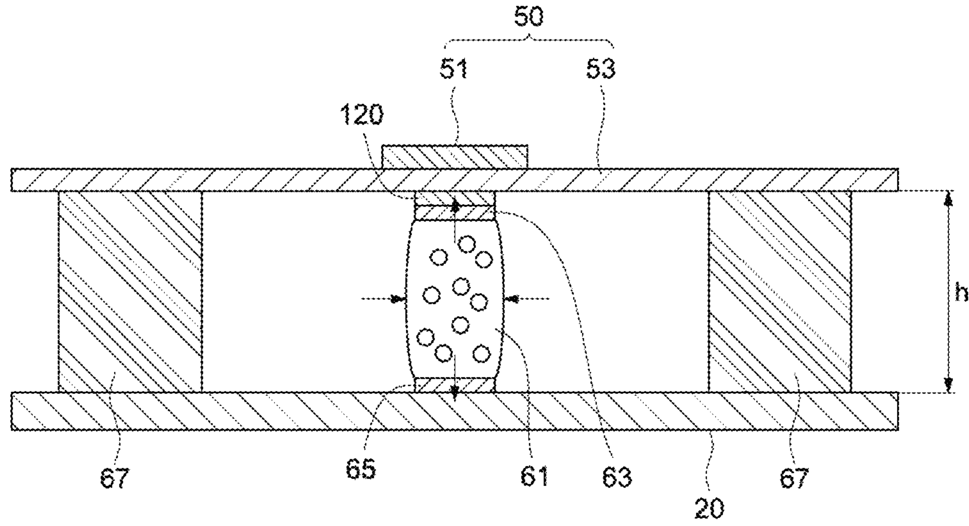
FIG. 10 is a schematic view illustrating a state in which a thermal insulation foam according to the present disclosure is disposed.

FIG. 10 is a schematic view illustrating a state in which the thermal insulation foam according to the present disclosure is disposed.

The thermal insulation foam 61 is disposed between the second thermal deformation medium 120 and the display panel 20 and inhibits the heat, which is absorbed from the circuit component 50 by the second thermal deformation medium 120, from being conducted to the display panel 20. The first bonding layer 63 may be disposed above the thermal insulation foam 61. The second bonding layer 65 may be disposed below the thermal insulation foam 61. In this case, a vertical height of the thermal insulation foam 61 may be determined depending on a thickness or height of a Tcon-PSA 67. The thermal insulation foam 61 may be manufactured to have a vertical height higher than a height h of the Tcon-PSA 67. Therefore, when the thermal insulation foam 61 is disposed between the second thermal deformation medium 120 and the display panel 20, the thermal insulation foam 61 may be disposed in a compressed state, as illustrated in FIG. 10. The thermal insulation foam 61 in the compressed state exhibits an elastic restoring force. Therefore, the thermal insulation foam 61 in the compressed state presses the second thermal deformation medium 120 and the circuit component 50, which may improve heat absorption between the second thermal deformation medium 120 and the circuit component 50.

Figure 11:
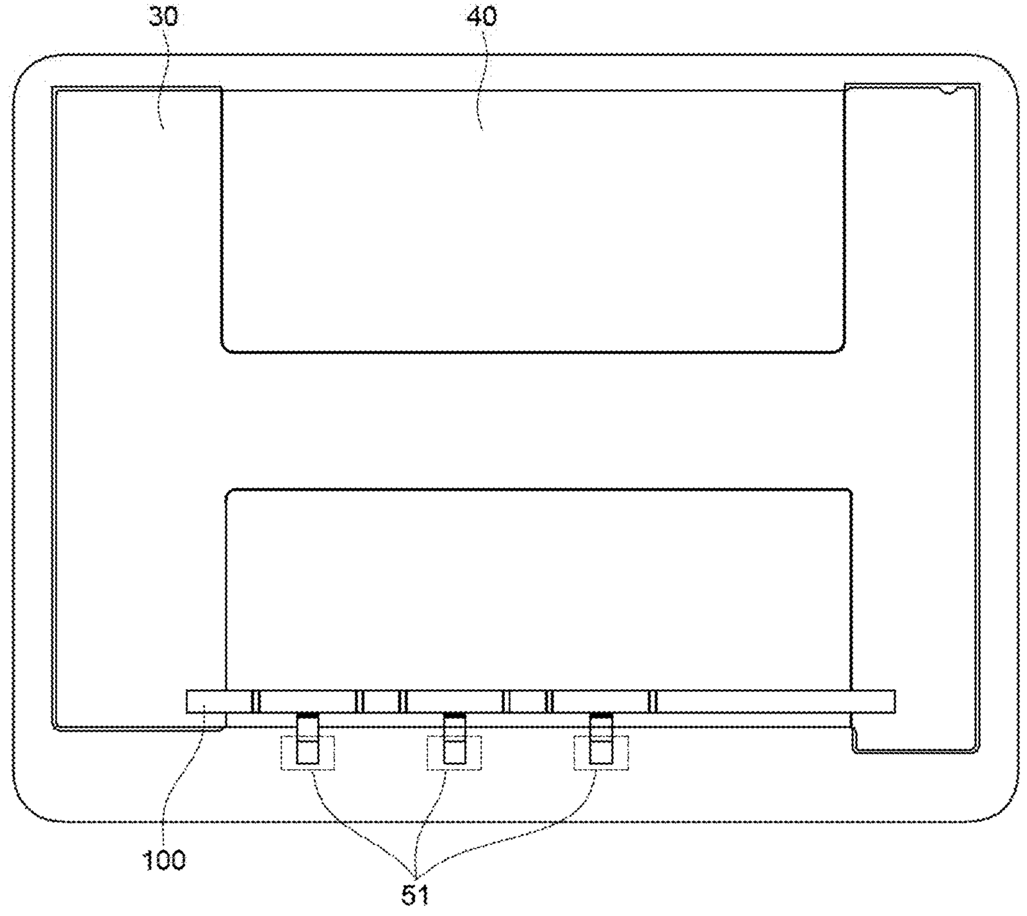
FIG. 11 is a rear view illustrating a state in which a heat dissipation module according to another embodiment of the present disclosure is installed in the display device.

FIG. 11 is a rear view illustrating a state in which a heat dissipation module according to another embodiment of the present disclosure is installed in the display device.

As illustrated in FIG. 11, the heat dissipation module 100 according to another embodiment of the present disclosure may be expanded depending on the number of circuit components 50. In detail, the first absorption portion 111, the second absorption portion 121, the first connection portion 115, and the second connection portion 125 vary in number depending on the number of driver ICs 51. Therefore, the heat dissipation module 100 may vary in shape depending on the number of driver ICs 51.

The exemplary embodiments of the present disclosure can also be described as follows:

According to an aspect of the present disclosure, there is provided a display device. The display device comprises display panel; a reinforcement plate configured to support the display panel; a circuit component configured to operate the display panel; and a heat dissipation module configured to reduce or minimize the occurrence of thermal stress in the circuit component and the reinforcement plate by absorbing heat, which is generated from the circuit component, and transferring the heat to the reinforcement plate, wherein the heat dissipation module comprises: first thermal deformation media and second thermal deformation media configured to adjoin the circuit component, absorb heat generated from the circuit component, and transfer the heat to the reinforcement plate; and a thermal conduction medium disposed between the first thermal deformation medium and the second thermal deformation medium and configured to transfer the heat between the first thermal deformation medium and the second thermal deformation medium.

The thermal conduction medium may have a coefficient of heat transfer higher than a coefficient of heat transfer of the first thermal deformation media and the second thermal deformation media and thus improve heat transfer between the first thermal deformation medium and the second thermal deformation medium rather than thermal conduction through the first thermal deformation medium and the second thermal deformation medium.

The first thermal deformation medium and the second thermal deformation medium may respectively comprise margin structures provided in a shape in which centers thereof are distant in a direction in which the centers face each other so that an internal space is provided between the first thermal deformation medium and the second thermal deformation medium, and wherein the margin structures may be stretched when the first thermal deformation medium and the second thermal deformation medium are thermally deformed by absorbing heat generated from the circuit component such that damage to the first thermal deformation medium and the second thermal deformation medium caused by the thermal deformation be suppressed.

The margin structures of the first thermal deformation media and the second thermal deformation media may be disposed to be symmetric so that the centers thereof be positioned on the same line.

At least a partial area of the second thermal deformation medium may adjoin a bottom surface of the circuit component, a thermal insulation foam may be disposed below the partial area to thermally insulate heat toward the display panel, and the heat absorbed by the second thermal deformation medium may be transferred to the reinforcement plate.

The partial area may include a creased area having a creased shape, and the creased area may increase an air fraction between the partial area and the thermal insulation foam so that the heat absorbed by the second thermal deformation medium may be transferred to the reinforcement plate.

The exemplary embodiments of the present disclosure can also be described as follows:

According to another aspect of the present disclosure, there is provided a display device. The display device comprises a display panel; a reinforcement plate configured to support the display panel; a circuit component configured to operate the display panel; and a heat dissipation module configured to reduce the occurrence of thermal stress in the circuit component and the reinforcement plate by absorbing heat, which is generated from the circuit component, and transferring the heat to the reinforcement plate, wherein the circuit component comprises: a driver IC (D-IC) configured to operate the display panel; and a printed circuit board (PCB) on which the driver IC is mounted, and wherein the heat dissipation module comprises: a first thermal deformation medium configured to adjoin the driver IC, absorb heat generated from the driver IC, and transfer the absorbed heat to the reinforcement plate; a second thermal deformation medium configured to adjoin the printed circuit board, absorb heat from the printed circuit board, and transfer the heat to the reinforcement plate; and a thermal conduction medium disposed between a predetermined zone of the first thermal deformation medium and a predetermined zone of the second thermal deformation medium and configured to transfer the heat between the first thermal deformation medium and the second thermal deformation medium.

The first thermal deformation medium may comprise a first absorption portion configured to adjoin a top surface and at least one side surface of the driver IC and absorb the heat from the driver IC; a first transfer portion connected to the reinforcement plate and configured to transfer the heat, which is absorbed by the first absorption portion, to the reinforcement plate; and a first connection portion configured to connect the first absorption portion and the first transfer portion, and wherein the second thermal deformation medium may comprise a second absorption portion configured to adjoin a bottom surface of the printed circuit board and absorb the heat from the printed circuit board; a second transfer portion connected to the reinforcement plate and configured to transfer the heat, which is absorbed by the second absorption portion, to the reinforcement plate; and a second connection portion configured to connect the second absorption portion and the second transfer portion.

The thermal conduction medium may be disposed in the first transfer portion and the second transfer portion and have a coefficient of heat transfer higher than a coefficient of heat transfer of the first transfer portion and the second transfer portion, and the thermal conduction medium may exchange heat between the first transfer portion and the second transfer portion so that the first transfer portion and the second transfer portion may be thermally deformed together.

The first transfer portion and the second transfer portion may respectively comprise margin structures provided in a shape in which centers thereof are distant in a direction in which the centers face each other so that an internal space is provided between the first transfer portion and the second transfer portion, wherein the first transfer portion and the second transfer portion in the margin structures may be spaced apart from the thermal conduction medium at a predetermined interval, and wherein the margin structures may be freely stretched when the first transfer portion and the second transfer portion are thermally deformed by the heat such that damage to the first transfer portion and the second transfer portion caused by the thermal deformation may be suppressed.

A thermal insulation foam layer may be disposed on a bottom surface of the second absorption portion to thermally insulate heat toward the display panel so that the heat absorbed by the second absorption portion may be conducted to the second connection portion.

The second absorption portion may have a creased area having at least a partial area with a creased shape, and the creased area may reduce or minimize the amount of heat transfer toward the display panel by increasing an air fraction between the second absorption portion and the thermal insulation foam layer.

The thermal insulation foam layer may comprise a thermal insulation foam including a plurality of pores; a first bonding layer disposed above the thermal insulation foam and configured to bond the thermal insulation foam to a bottom surface of the second absorption portion; and a second bonding layer disposed below the thermal insulation foam and configured to bond the thermal insulation foam to a top surface of the display panel, and wherein the heat absorbed by the second absorption portion may be thermally insulated in a direction toward the display panel and dissipated in a direction toward the second transfer portion.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a display panel;

a reinforcement plate configured to support the display panel;

a circuit component configured to operate the display panel; and a heat dissipation module configured to reduce the occurrence of thermal stress in the circuit component and the reinforcement plate by absorbing heat, which is generated from the circuit component, and transferring the heat to the reinforcement plate, wherein the heat dissipation module comprises:

first thermal deformation media and second thermal deformation media configured to adjoin the circuit component, absorb heat generated from the circuit component, and transfer the heat to the reinforcement plate; and a thermal conduction medium disposed between the first thermal deformation medium and the second thermal deformation medium and configured to transfer the heat between the first thermal deformation medium and the second thermal deformation medium.

2. The display device of claim 1, wherein the thermal conduction medium has a coefficient of heat transfer higher than a coefficient of heat transfer of the first thermal deformation media and the second thermal deformation media and thus improves heat transfer between the first thermal deformation medium and the second thermal deformation medium rather than thermal conduction through the first thermal deformation medium and the second thermal deformation medium.

3. The display device of claim 1, wherein the first thermal deformation medium and the second thermal deformation medium respectively comprise margin structures provided in a shape in which centers thereof are distant in a direction in which the centers face each other so that an internal space is provided between the first thermal deformation medium and the second thermal deformation medium.

4. The display device of claim 3, wherein the margin structures of the first thermal deformation media and the second thermal deformation media are disposed to be symmetric so that the centers thereof are positioned on the same line.

5. The display device of claim 3, wherein the margin structures are stretched when the first thermal deformation medium and the second thermal deformation medium are thermally deformed by absorbing heat generated from the circuit component such that damage to the first thermal deformation medium and the second thermal deformation medium caused by the thermal deformation is suppressed.

6. The display device of claim 1, wherein at least a partial area of the second thermal deformation medium adjoins a bottom surface of the circuit component, a thermal insulation foam is disposed below the partial area to thermally insulate heat toward the display panel, and the heat absorbed by the second thermal deformation medium is transferred to the reinforcement plate.

7. The display device of claim 6, wherein a first bonding layer disposed above the thermal insulation foam is configured to bond a top surface of the thermal insulation foam to a bottom surface of the second thermal deformation medium.

8. The display device of claim 6, wherein a second bonding layer disposed below the thermal insulation foam is configured to bond a bottom surface of the thermal insulation foam to a top surface of the display panel.

9. The display device of claim 8, wherein the thermal insulation foam comprises a plurality of pores, and a central portion of the second bonding layer is configured as an empty space to thermally insulate the thermal insulation foam and the display panel.

10. The display device of claim 6, wherein the partial area includes a creased area having a creased shape, and the creased area increases an air fraction between the partial area and the thermal insulation foam so that the heat absorbed by the second thermal deformation medium is transferred to the reinforcement plate.

11. The display device of claim 1, wherein the circuit component comprises:

a driver IC configured to operate the display panel; and a printed circuit board on which the driver IC is mounted.

12. A display device, comprising:

a display panel;

a reinforcement plate configured to support the display panel;

a circuit component configured to operate the display panel; and a heat dissipation module configured to reduce the occurrence of thermal stress in the circuit component and the reinforcement plate by absorbing heat, which is generated from the circuit component, and transferring the heat to the reinforcement plate, wherein the circuit component comprises:

a driver IC configured to operate the display panel; and a printed circuit board on which the driver IC is mounted, and wherein the heat dissipation module comprises:

a first thermal deformation medium configured to adjoin the driver IC, absorb heat generated from the driver IC, and transfer the absorbed heat to the reinforcement plate;

a second thermal deformation medium configured to adjoin the printed circuit board, absorb heat from the printed circuit board, and transfer the heat to the reinforcement plate; and a thermal conduction medium disposed between a predetermined zone of the first thermal deformation medium and a predetermined zone of the second thermal deformation medium and configured to transfer the heat between the first thermal deformation medium and the second thermal deformation medium.

13. The display device of claim 12, wherein the first thermal deformation medium comprises:

a first absorption portion configured to adjoin a top surface and at least one side surface of the driver IC and absorb the heat from the driver IC;

a first transfer portion connected to the reinforcement plate and configured to transfer the heat, which is absorbed by the first absorption portion, to the reinforcement plate; and a first connection portion configured to connect the first absorption portion and the first transfer portion, and wherein the second thermal deformation medium comprises:

a second absorption portion configured to adjoin a bottom surface of the printed circuit board and absorb the heat from the printed circuit board;

a second transfer portion connected to the reinforcement plate and configured to transfer the heat, which is absorbed by the second absorption portion, to the reinforcement plate; and a second connection portion configured to connect the second absorption portion and the second transfer portion.

14. The display device of claim 13, wherein the thermal conduction medium is disposed in the first transfer portion and the second transfer portion and has a coefficient of heat transfer higher than a coefficient of heat transfer of the first transfer portion and the second transfer portion, and the thermal conduction medium exchanges heat between the first transfer portion and the second transfer portion so that the first transfer portion and the second transfer portion are thermally deformed together.

15. The display device of claim 14, wherein the first transfer portion and the second transfer portion respectively comprise margin structures provided in a shape in which centers thereof are distant in a direction in which the centers face each other so that an internal space is provided between the first transfer portion and the second transfer portion, wherein the first transfer portion and the second transfer portion in the margin structures are spaced apart from the thermal conduction medium at a predetermined interval, and wherein the margin structures are freely stretched when the first transfer portion and the second transfer portion are thermally deformed by the heat such that damage to the first transfer portion and the second transfer portion caused by the thermal deformation is suppressed.

16. The display device of claim 13, wherein a thermal insulation foam layer is disposed on a bottom surface of the second absorption portion to thermally insulate heat toward the display panel so that the heat absorbed by the second absorption portion is conducted to the second connection portion.

17. The display device of claim 16, wherein the second absorption portion has a creased area having at least a partial area with a creased shape, and the creased area reduces the amount of heat transfer toward the display panel by increasing an air fraction between the second absorption portion and the thermal insulation foam layer.

18. The display device of claim 16, wherein the thermal insulation foam layer comprises:

a thermal insulation foam including a plurality of pores;

a first bonding layer disposed above the thermal insulation foam and configured to bond the thermal insulation foam to a bottom surface of the second absorption portion; and a second bonding layer disposed below the thermal insulation foam and configured to bond the thermal insulation foam to a top surface of the display panel, and wherein the heat absorbed by the second absorption portion is thermally insulated in a direction toward the display panel and dissipated in a direction toward the second transfer portion.

* * * * *